(12) United States Patent
Khouri et al.

(10) Patent No.: US 6,259,632 B1
(45) Date of Patent: Jul. 10, 2001

(54) CAPACITIVE COMPENSATION CIRCUIT FOR THE REGULATION OF THE WORD LINE READING VOLTAGE IN NON-VOLATILE MEMORIES

(75) Inventors: Osama Khouri, Milan; Rino Micheloni, Turate; Ilaria Motta, Cassolnovo; Andrea Sacco, Alessandria; Guido Torelli, Sant'Alessio Con Vialone, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/491,475

(22) Filed: Jan. 19, 2000

(30) Foreign Application Priority Data

Jan. 19, 1999 (IT) .............................. MI99A0080

(51) Int. Cl.$^7$ ................................... G11C 16/06
(52) U.S. Cl. ..................................... 365/185.23
(58) Field of Search ........................ 365/185.23, 230.06, 365/226, 227, 183, 189.09, 203; 327/530, 538, 540

(56) References Cited

U.S. PATENT DOCUMENTS

| | | | |
|---|---|---|---|
| 5,253,202 | * 10/1993 | Bronner et al. | 365/189.01 |
| 5,291,446 | * 3/1994 | Van Buskirk et al. | 365/189.09 |
| 5,511,026 | * 4/1996 | Cleveland et al. | 365/189.09 |
| 5,546,042 | * 8/1996 | Tedrow et al. | 327/538 |
| 5,563,842 | * 10/1996 | Challa | 365/230.06 |
| 5,994,948 | * 11/1999 | Bartoli et al. | 327/536 |
| 6,002,630 | * 12/1999 | Chuang et al. | 365/226 |

* cited by examiner

Primary Examiner—Richard Elms
Assistant Examiner—Anh Phung
(74) Attorney, Agent, or Firm—Theodore E. Galanthay; E. Russell Tarleton; Seed IP Law Group PLLC

(57) ABSTRACT

Circuit for the regulation of the word line voltage in a memory, including a voltage regulator suitable to generate an output regulated voltage to be supplied to one or more word lines of the memory when said one or more word lines are being selected, and charge accumulation means that are selectively connectable with the output of the voltage regulator and suitable to accumulate a compensation charge for a voltage drop that takes place on said regulated voltage upon the selection of said one or more word lines of the memory.

16 Claims, 5 Drawing Sheets

CAPACITIVE COMPENSATION CIRCUIT FOR THE REGULATION OF THE WORD LINE READING VOLTAGE IN NON-VOLATILE MEMORIES

TECHNICAL FIELD

The present invention refers to the field of semiconductor memories, and in particular non-volatile type memories. More specifically, the invention concerns a circuit for the regulation of the word line voltage during the step of reading of a non-volatile memory, particularly but not exclusively a multilevel non-volatile memory (that is a memory whose cells are programmable to one of more levels of threshold voltage, and that are therefore capable to store more than one bit per single cell), for instance a multilevel non-volatile memory integrated in a device with a single supply voltage.

BACKGROUND OF THE INVENTION

As known, for the reading of multilevel non-volatile memories it is necessary to provide the addressed word line of the memory cell matrix with a stable and accurate voltage, with the aim of assuring optimal conditions for the reading operation. In multilevel memories the difference between the values of memory cell threshold voltage corresponding to the different logic states storable in the same cell is reduced compared to the case of traditional non-volatile memory cells with two programming levels that are capable of storing one bit only.

Consequently, the reading voltage for the word lines that are in turn addressed must be supplied through a voltage regulator, as shown in FIG. 1, where there is a voltage regulator 1, supplied with a voltage $V_{sup}$ that is generally different from the memory supply voltage $V_{DD}$. A row decoding circuit 2 decodes row addresses Ai whose logic levels "0" and "1" correspond to the ground voltage and to the memory supply voltage $V_{DD}$. A voltage elevator circuit 3 increases the value of voltage corresponding to the logic state "1" from $V_{DD}$ to a higher value $V_R$. A final driving stage 4 for a respective word line (word line driver) is supplied with the voltage $V_{reg}$ provided by the regulator 1. $C_R$ represents the global capacitive load connected with the output of the regulator 1 when no word line is selected.

In multilevel memories the voltage $V_{Sup}$ is typically higher than the memory supply voltage $V_{DD}$, which in devices of the current generation has a nominal value of 3 V. The more commonly adopted technique for the generation of voltages higher than $V_{DD}$ inside a MOS technology integrated circuit is the utilization of voltage multiplication circuits with a charge pump. Circuits of this type are capable of providing the required values of voltage, but they generally have limited ability to deliver output current; and when they are started (for instance when the integrated circuit is turned on or when returning from a condition of disabling ("power down") or of quiescence ("stand-by") in which the circuit is turned off with the purpose of obtaining power consumption saving) they require a certain time to bring the output voltage from the initial zero value to the desired value, and this time is greater as the capacitance value of the same circuit output charge increases.

The elevator circuit 3 can be made up of a pull-up P-channel MOS transistor connected between the input of the word line driver 4 and the supply line $V_{reg}$ of the same driver 4 and with the gate electrode grounded. Other techniques can obviously be used for this purpose.

The enabling of a specific word line of memory cells takes place when the address of the location of memory to be sensed changes, in the example herein shown the row address signals Ai, or in any case when an opportune signal is provided that indicates that one (or more) determined word line must be selected and activated. The decoder 2 generates output logic signals that are suitable to select the desired word line through the final stages 4. Each final stage 4 is essentially made up of a CMOS inverter.

FIG. 2 schematically illustrates a circuit that can typically be utilized for the voltage regulator 1 of FIG. 1. The voltage regulator is substantially made up of a loop comprising an operational amplifier A connected in negative feedback through two resistors R1, R2, which provides an output voltage $V_{reg}$ with nominal value equal to $V_R$. The operational amplifier A receives a fixed reference voltage $V_{BG}$ on the non-inverting terminal. If the gain of the operational amplifier is sufficiently high, ignoring non-idealities as the offset voltages, the output voltage of the regulator 1 is equal to:

$$V_{reg}=V_{BG}=(1+R1/R2).$$

In an integrated circuit the relationship between the resistances of the two resistors R1 and R2 can be realized with a very high degree of precision, still neglecting non-ideal effects, so that the accuracy of the value of the generated voltage $V_{reg}$ substantially depends on the accuracy of the value of the reference voltage $V_{BG}$. The latter can be obtained in a known way by means of a generator of "band-gap" reference voltage that generates a very accurate voltage and that is provided with a good stability even with variable parameters such as supply voltage and temperature.

The single word line is perceived by the regulator 1 as a capacitive load $C_W$ (more precisely, the word line is a distributed RC load), since the word line does not determine an absorption of direct current, but it has non-negligible stray capacitance, substantially connected between said word line and ground, or between the word line and other nodes (for descriptive simplicity the global stray capacitance $C_W$ can however be considered to be connected between the word line and ground).

When a determined word line of the memory matrix (array) is not being addressed, it is grounded, and therefore the capacitance $C_W$ associated with it is discharged.

When the word line is addressed, its voltage must be brought by the respective driver 4 to the value required for the correct execution of the reading operation, a value that will be indicated by $V_R$. More precisely, for a correct execution of the reading operation, the voltage of the word line must be within a determined interval around the value $V_R$. When the word line is selected, it is connected with the output of the voltage regulator 1 by the driver 4. The voltage $V_{reg}$ supplied by the regulator, that in static conditions is ideally equal to $V_R$, undergoes a decrement. The decrement is due to a phenomenon of "charge sharing" between the total load capacitive $C_R$ connected with the output of the regulator when no word line is selected, and the capacitance $C_W$ of the word line. Whenever for reasons of memory architecture more word lines are selected simultaneously, then the load that is connected to the output of the voltage regulator (and that will give rise to the phenomenon of charge sharing) will consist of the total capacitive load of all the word lines that have simultaneously been selected. Hereinafter, the symbol $C_W$ will be referred to the total load that is connected with the output of the regulator.

The decrement in the output voltage of the voltage regulator is very quick, as the phenomenon of charge sharing is very fast, and it can be excessive in the sense that the value of the voltage $V_{reg}$ can go out of the interval required for the correct execution of the reading operation. The recovery of the voltage $V_{reg}$, that is the recovery of the output voltage of the regulator within the interval that permits an optimal reading, must be sufficiently fast so that the time of access of the memory is not degraded and, above all, no erroneous reading occurs.

Purely as an example, considering the case of EEPROM Flash memories in submicrometric technology that are organized in memory sectors with appropriate size, the values involved are reasonably the following:

$V_R$=6 V;

$C_R$=100 pF;

$C_W$=3 pF;

$\Delta V_{max}$=50 mV, where $\Delta V_{max}$ indicates the maximum error allowed for the voltage $V_{reg}$ during the reading step; in other words, the recovery of the voltage $V_{reg}$ after the selection of the new word line (or word lines) is considered to be obtained when the voltage $V_{reg}$ is brought back to a value within 50 mV of the value in regime conditions of $V_{reg}$, that is $V_R$, and it remains within 50 mV around this value afterwards.

The stray capacitance $C_R$ connected with the output of the voltage regulator (100 pF in the example reported herein) is very remarkable. Such capacitance is due to the components that are physically necessary in order to realize the row decoding. In fact, the voltage regulator supplies the final stages of the row decoding circuit. Therefore, it is not possible to reduce such stray capacitance in a substantial way. The presence of a high stray capacitive load slows down the operation of the voltage regulator. In particular, there will be a considerable slowness in the recovery of the output voltage $V_{reg}$ in the above mentioned case of decrement in the $V_{reg}$ due to charge sharing following the selection of a word line that was previously grounded.

Considering the sample values reported above, it is possible to calculate the requirement in terms of current from the voltage regulator upon the selection of a word line. The charge required by the capacitance $C_W$ in coincidence with the selection of the word line is equal to:

$(V_R-\Delta V_{max}) \times C_W = 14.28$ pC.

If we take as an objective recovery time of 20 ns, the current hat the regulator must deliver in the case of maximum efficiency (no loss), and assuming a delivery with current constant through time, is equal to 715 µA. The real current requirement might in practice be higher because of non-ideal effects that decrease the general efficiency of the circuit.

When the reading of a determined word line is enabled, this must be charged at the voltage $V_R$. The charge initially stored in the capacitance $C_R$ is shared by charge sharing with the stray capacitance $C_W$ of the selected word line. As a consequence of the phenomenon of charge sharing, the voltage at the output of the regulator 1 is:

$V_{reg} = C_W \times V_R / (C_W + C_R)$

Therefore a voltage drop will be determined at the output of the voltage regulator 1 that will ideally be equal to:

$\Delta V_R = V_R - V_{reg} = V_R/(1+C_R/C_W) \cong V_R \times C_W/C_R$.

With the exemplification values herein provided, the result will be $\Delta V_R \cong 200$ mV, that is higher than the maximum allowed value $\Delta V_{max}$ of 50 mV. Therefore, in the presence of high total capacitive loads at the output of the regulator 1, the recovery of the Voltage $V_{reg}$ can be excessively slow, since the gain-bandwidth product of the amplification structure is obviously limited.

SUMMARY OF THE INVENTION

The present invention provides a circuit for the regulation of the word line reading voltage that guarantees a fast recovery of the regulated voltage $V_{reg}$ when one (or more) new word line is selected.

According to an embodiment of the present invention, a circuit for the regulation of the word line voltage in a memory includes a voltage regulator suitable to generate an output regulated voltage to be supplied to one or more word lines of the memory when said one or more word lines are being selected, and a charge accumulation means that are selectively connectable with the output of the voltage regulator and suitable to accumulate a compensation charge for a voltage drop that takes place at said regulated voltage upon the selection of said one or more word lines of the memory.

BRIEF DESCRIPTION OF THE DRAWINGS

The characteristics and the advantages of the present invention will be made more evident in the following detailed description of two embodiments thereof, that are illustrated as non-limiting examples in the enclosed drawings, in which.

DETAILED DESCRIPTION OF THE INVENTION

A circuit according to an embodiment of the present invention provides a capacitance compensation for the voltage drop that takes place at the output of the regulator upon the selection of one (or more) new word line. A basic idea of the present invention is the following. The quantity of charge $C_W \times V_R$ that is required to bring the voltage of the elected word line (word lines) from 0V (ground) to $V_R$ is provided by an additional capacitor ($C_{add}$) that has previously been precharged at a voltage ($V_{PR}$) higher than $V_R$, that is $V_{PR}=V_R+\Delta V$. The value $\Delta V$ is selected in an appropriate way, as described below. In this way, no delivery of the quantity of charge $C_W \times V_R$ is required from the voltage regulator that provides the regulated voltage $V_{reg}$. Since such charge is provided by the additional capacitor through a phenomenon of charge sharing, the recovery of the output voltage of the voltage regulator will be very rapid, ideally instantaneous if the present stray resistances in the circuit are negligible.

Figure 1:
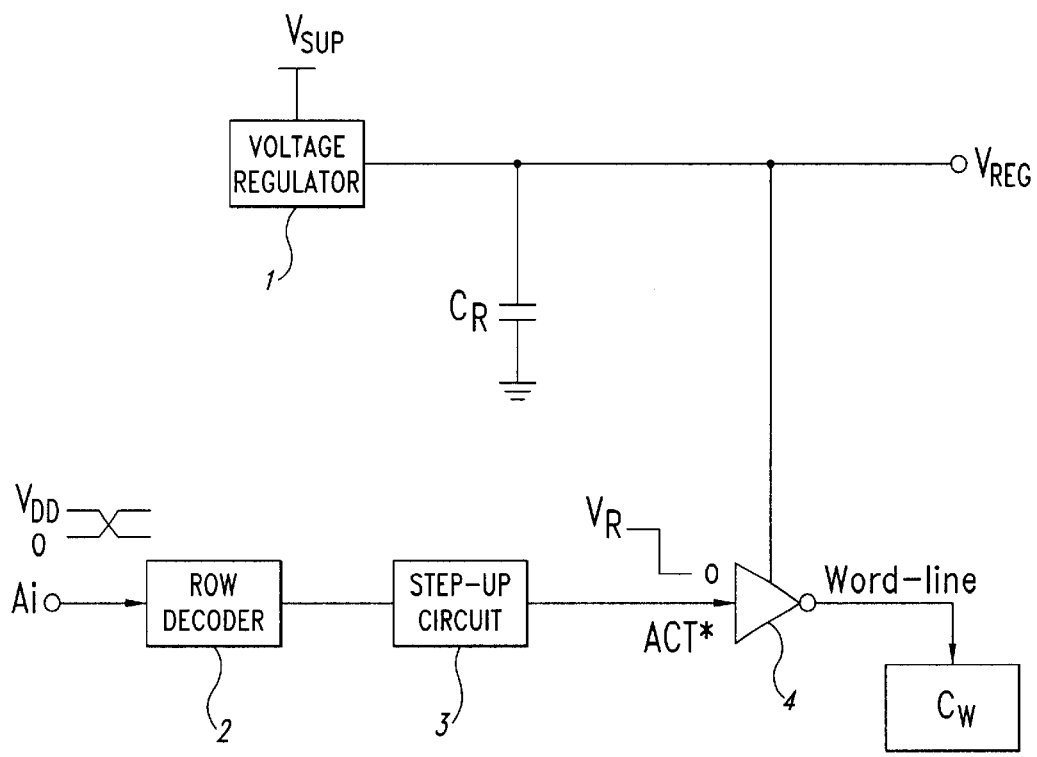
FIG. 1 schematically shows a circuit for the selection of word lines with a regulator of word line voltage according to the known technique.
Figure 2:
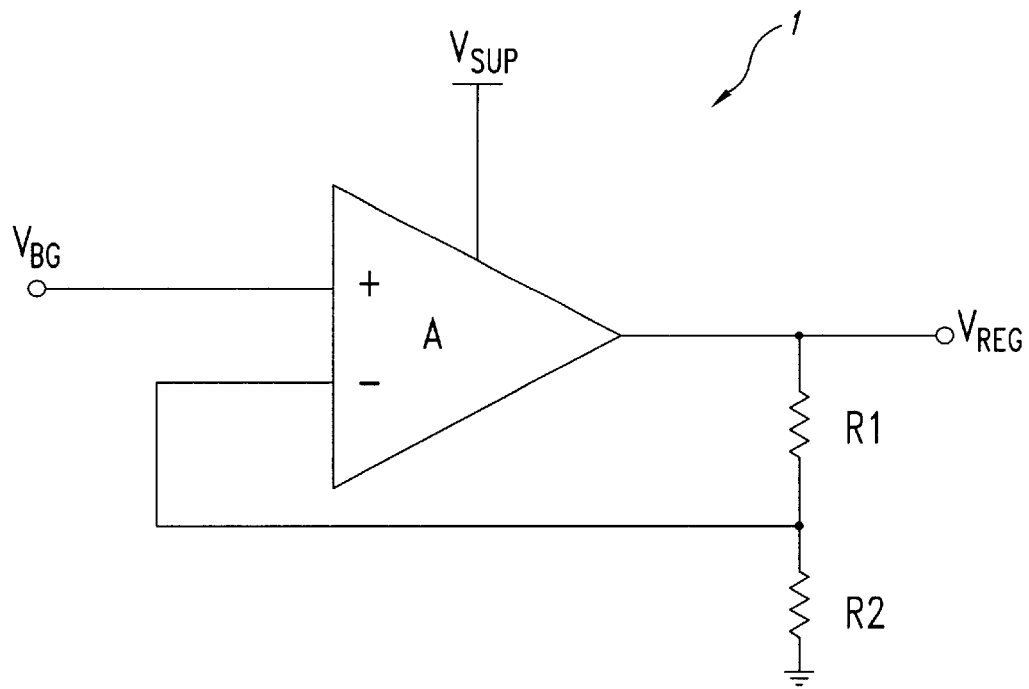
FIG. 2 schematically shows the voltage regulator circuit of FIG. 1.
Figure 3:
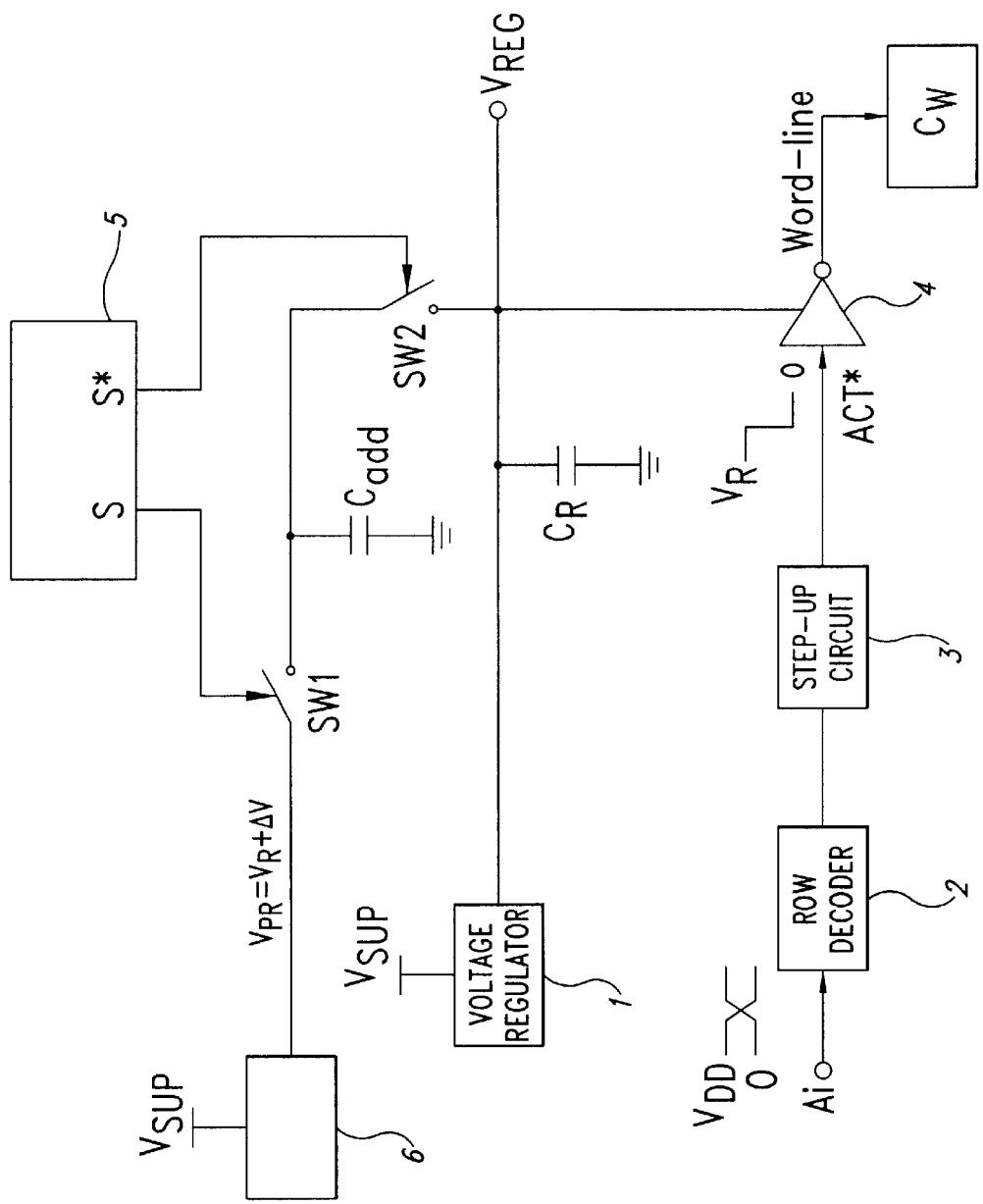
FIG. 3 schematically shows a circuit according to a first embodiment of the present invention.

With reference to FIG. 3, there is shown a circuit according to a first embodiment of the present invention. In FIG. 3, the same elements already present in the circuit of FIG. 1 are referred to by the same reference numbers. The circuit of FIG. 3 comprises an additional capacitor $C_{add}$ with a plate at ground and a circuit for the precharging of the same. Said precharging circuit comprises two switches SW1, SW2 for the proper connection of the other plate of the capacitor $C_{add}$, a control circuit 5 for driving the two switches SW1, SW2, and a voltage generator 6 to generate a voltage $V_{PR}$ adequately higher than the voltage $V_R$. The circuit 6 can be a generic voltage generator. As an alternative, the circuit 6 can be a voltage regulator similar to the voltage regulator 1, supplied with the voltage $V_{sup}$.

The values of the capacitor $C_{add}$ and of the voltage $V_{PR}$, and therefore of $\Delta V$, are selected in such a way that, once the transient is over, the following relationship is true:

$$C_{add} \times (V_R + \Delta V) + C_R \times V_R = (C_{add} + C_W + C_R) \times V_R$$

from which it follows that:

$$C_{add} \times \Delta V = C_W \times V_R.$$

Therefore, substantially, the additional capacitor $C_{add}$ provides the capacitance $C_W$ of the selected word line (word lines) with the charge $C_{add} \times \Delta V = C_W \times V_R$, that is necessary for the previously grounded selected word line (word lines) to be brought to the desired voltage value $V_R$. The relationship $C_{add} \times \Delta V = C_W \times V_R$ immediately allows to size the product $C_{add} \times \Delta V$ and, therefore, the two values $C_{add}$, $\Delta V$.

The precharging of the additional capacitor $C_{add}$ with the voltage $V_{PR}$ and its subsequent connection with the output line $V_{reg}$ of the voltage regulator 1 are carried out by means of the two switches SW1, SW2, that are activated by control signals of S and S* generated by the control circuit 5. The two signals S and S* are substantially logic signals having values complementary to each other, that are adequately shifted so that their active phases are not overlapping.

When operating, the additional capacitor $C_{add}$ is precharged to the voltage $V_{PR}$ before one (or more) new word line is selected; to such purpose, the switch SW1 is closed while the switch SW2 is open. When one (or more) new word line must be selected, the switch SW1 is thus open, and the switch SW2 gets closed, in order to connect the capacitor $C_{add}$ between the output $V_{reg}$ of the regulator 1 and ground.

Assuming that the voltage regulator 1 does not exert any intervention (as it can happen, at least ideally, as shown afterwards), the balance of charge on the line $V_{reg}$ in stationary conditions is the following:

$$Q_{IN} = C_R \times V_R + C_{add} \times (V_R + \Delta V) = Q_{FIN} = (C_{add} + C_W + C_R) \times V_{FIN}$$

from which, taking into account that $C_{add} \times \Delta V = C_W + V_R$, we have:

$$(C_{add} + C_W + C_R) \times V_R = (C_{add} + C_W + C_R) \times V_{FIN}$$

that means $V_{FIN} = V_R$.

In the previous relationships, $V_{FIN}$, is the value of the voltage $V_{reg}$ at the end of the transient, and $Q_{IN}$ and $Q_{FIN}$ are the values of the charges in the capacitance system ($C_{add}$, $C_W$, $C_R$) respectively at the beginning and at the end of the transient.

At least ideally, the voltage on the line $V_{reg}$ therefore reaches the value $V_R$ even without any intervention of the voltage regulator 1.

After a certain interval of time, that is after the capacitor $C_{add}$ has transferred the charge stored therein to the capacitance connected with the line $V_{reg}$, the capacitor $C_{add}$ gets disconnected from the line $V_{reg}$ by opening the switch SW2, and it gets connected again with the output of the generator 6 by closing the switch SW1, in order for it to precharge again with the voltage $V_{PR}$ and to be therefore ready to intervene at a later access to the memory. The disconnection of the capacitor $C_{add}$ from the line $V_{reg}$ can for instance be carried out after a predetermined interval of time from the instant in which it was connected with the same line $V_{reg}$, or once the reading operation of the addressed memory cell (or cells) is over; in this second case, in order to control the disconnection of the capacitor $C_{add}$ from the line $V_{reg}$, it will be possible to use an "end of reading" signal that will already be present in the memory for other purposes.

It should be noticed that when the voltage generator 6 consists of a voltage regulator analogous to the regulator 1, the capacitive load connected with the output of the voltage regulator 6 is not high, since the capacitive load $C_R$ is never directly connected with the output of the regulator 6. The regulator 6 can therefore be very fast, and as a consequence the time necessary for the precharging of the capacitor $C_{add}$ will be very short.

In addition, if desirable, the step of precharging of the capacitor $C_{add}$ can be prolonged even for a time longer than the one required for the recovery of the voltage $V_{reg}$. For such purpose, in fact, it is ideally possible to devote the entire time between the instant in which the capacitor $C_{add}$ is disconnected from the line $V_{reg}$ and gets connected with the output of the voltage generator 6, and the instant in which, because of the request of a subsequent reading operation, the capacitor $C_{add}$ must be connected again to the line $V_{reg}$ (what in fact is essential is that at this second instant the capacitor $C_{add}$ is precharged at the voltage $V_{PR}$)

In order for the described method to be particularly effective, it is necessary for the "additional" quantity of charge $C_{add} \times \Delta V$ to be as much as possible equal to the charge $C_W \times V_R$ that is necessary to bring the voltage of the selected word line (word lines) to the value $V_R$. In other words, it is necessary that between the quantities $C_{add} \times \Delta V$ and $C_W \times V_{reg}$ there is what is referred to as a good "matching"; that means that it is necessary to have a good matching between $C_{add}$ and $C_W$, and that the value of voltage $\Delta V$ must be accurate. The value $\Delta V$ can be obtained with a good degree of precision by generating the voltage $V_R + \Delta V$ by means of a known type control circuit that utilizes a bandgap type reference voltage. The best solution to the problem of having a good matching between $C_{add}$ and $C_W$ consists in realizing the additional capacitor $C_{add}$ by means of fictitious ("dummy") word lines, that is by means of word lines that are exactly equal to the ones found in the memory matrix, in whose memory cells no information accessible from the outside is stored and that have the purpose to realize a capacitive load that substantially coincides with the one found in one (or more) generic word line of the memory matrix.

In order to adequately evaluate the quantity of charge provided by the capacitor $C_{add}$ and by the circuitry associated with it, it is necessary to take into account the stray capacitances associated with the switches SW1, SW2 and to the line connected with the upper plate of the capacitor $C_{add}$, as well as the charge injection effects and the so-called "clock feedthrough" effect that are caused by the closing/opening of the switches SW1, SW2, as it will be evident to technicians in the field. As for what concerns the efficiency in the transfer of the charge stored in the capacitor $C_{add}$, it is clear that in practice a loss in efficiency due for instance to the intervention of the voltage regulator 6 and to the presence of stray capacitances will have to be taken into account.

In case the new access to the memory, that is the new request of reading, involves one (or more) memory word belonging to the same word line (word lines) that is already being addressed, if the word line is already selected and therefore the relative capacitance $C_W$ is already charged at the voltage $V_R$, it will not be necessary to activate the capacitance compensation circuitry. In this way it will be possible to avoid providing the line $V_{reg}$ with an additional of charge that would modify the voltage in an undesirable way. That will obtained for instance by operating on the circuit of control 5 so as to inhibit the quenching of the signal S and the activation of the signal S*. The switch SW2 will not be closed and no additional charge $C_{add} \times \Delta V$ will be provided on the line $V_{reg}$.

In an ideal case, the charge that the voltage regulator 1 must deliver upon a reading request will be zero. All the charge required to charge the capacitance $C_W$ of the word line (word lines) with the voltage $V_R$ is in fact provided by the additional capacitor $C_{add}$, to which such charge is supplied by the generator, in particular voltage regulator, 6. This voltage regulator 6 has a rather limited total output capacitive load, consisting in the additional capacitor $C_{add}$ plus other stray capacitances that, with a good physical design of the circuit, are lower than $C_{add}$ in value. Therefore, the voltage regulator 6 can be sized in such a way so as to be fast as a result. In addition, the current that the voltage regulator 6 must deliver is less high than in the case of the circuit of FIG. 1 according to the known technique, since more time is required to perform the precharging of the additional capacitor $C_{add}$.

A variation to this first embodiment of the invention consists in providing not one, but rather two or more additional capacitors, for instance all equal to each other, that are precharged at the voltage $V_R+\Delta V$. When the selection of one (or more) new word line of the memory is made, first additional capacitor is connected with the line $V_{reg}$. If within a limited time, that means before the first additional capacitor has been precharged again with the correct value of voltage, there is a new reading request that involves a different word line, a second additional capacitor will be connected with the line $V_{reg}$, and so on.

Figure 4:
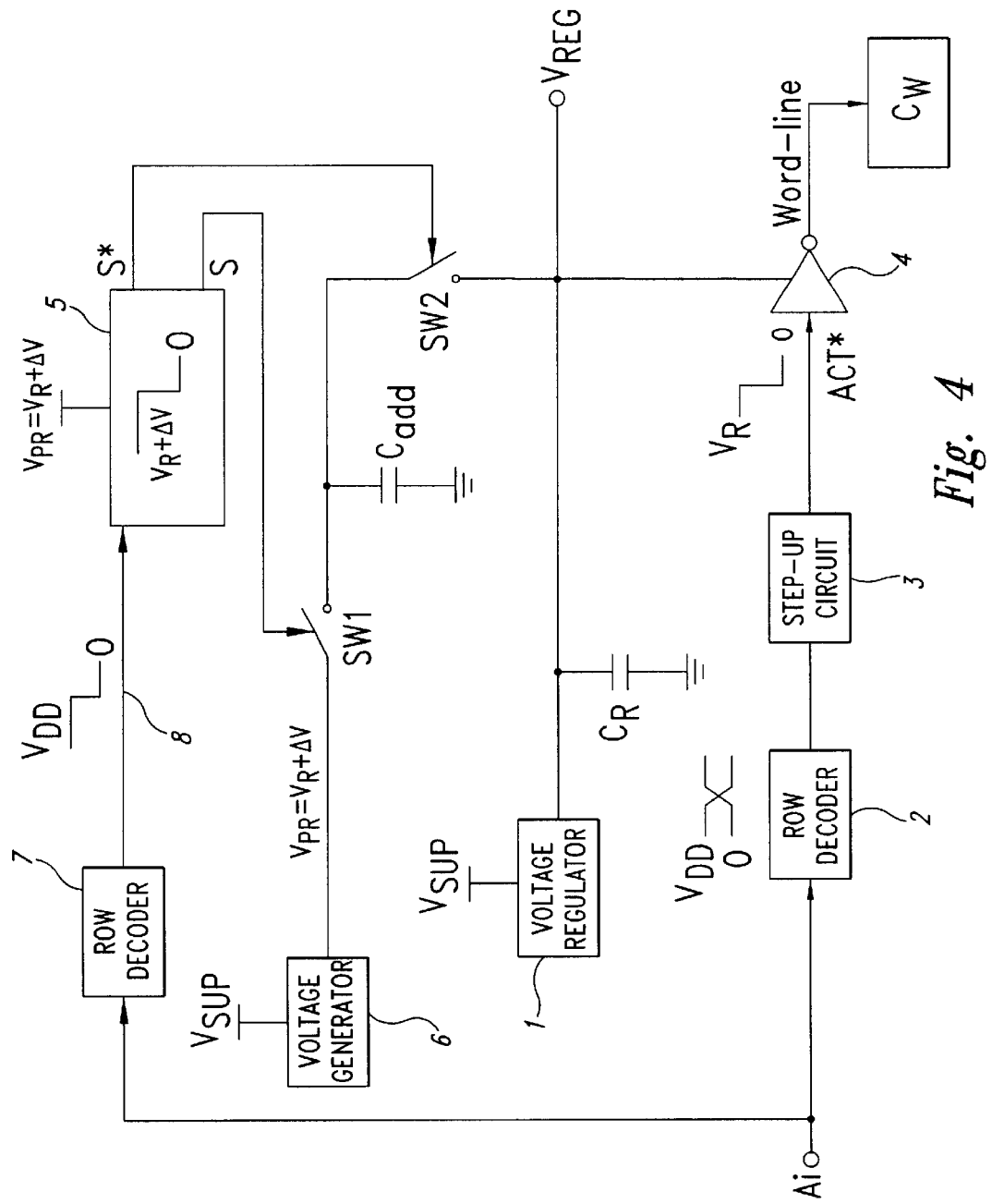
FIG. 4 schematically shows the circuit of FIG. 3, complete with control elements.

FIG. 4 is a complete circuit scheme of the circuit according to the first embodiment of the invention, where the elements that are common with the embodiment of FIG. 3 are still indicated by means of the same reference numbers. The signals S and S* that control the opening and closing of the switches SW1 and SW2 are generated by the control circuit starting from the same address signals Ai that feed the row decoder 2. For this purpose, a dummy row decoder 7, similar to the row decoder 2, that receives the address signals Ai and that drives the control circuit 5, is preferably provided. The latter is supplied with the voltage $V_{PR}$, so that the signals S, S* vary not between ground and $V_{DD}$, but between ground and $V_{PR}$. This is necessary because the signals S, S* control circuit elements that control the voltage $V_{PR}$. The signal S* that drives the switch SW2 is for instance obtained by means of a chain in which the path of the signal is in proper relationship (for example substantially identical) with the signals that, starting from the signals of address Ai, generate the signals ACT * which drive the drivers 4 of the word lines. The structure necessary to obtain the correct levels of voltage for the signals S and S* (that is, as previously mentioned, ground and $V_{PR}$) can be equal to the one that carries out the analogous function for what concern the signals ACT * (voltage elevator circuits 3).

The switch SW2 can for instance be substantially identical to the "pull-up" transistor of the word line driver 4. In this way the delay of the switching edge of the signal S * that determines the closing of the switch SW2 as compared with the switching edges of the address signals Ai will substantially coincide with the delay of the switching edge "1"→"0" of the signal ACT * from the switching edges of the address signals Ai. This substantially maintains the desired time relationship between the switching edges of the signals ACT * and S* even in the presence of variations in the manufacturing process, in temperature and in operation, and therefore to have an excellent "matching" between the delays of the connection to the line $V_{reg}$ of the selected word line and of the additional capacitor $C_{add}$.

The circuits shown in FIGS. 3 and 4 and described previously preferably require an additional voltage regulator 6, for the generation of the voltage $V_{PR}$, that is higher than the voltage $V_R$. It is therefore necessary to avail, in the integrated circuit, of a voltage generator capable to supply a voltage higher than the one required for the voltage generator $V_{sup}$. This, as previously pointed out, can create some problems, in particular at the starting of the integrated circuit or at the recovery from a disabled condition ("power down") or quiescence condition ("stand-by"), if for instance the generator of supply voltage is realized by means of the utilization of voltage multipliers based on the principle of the charge pump.

Figure 5:
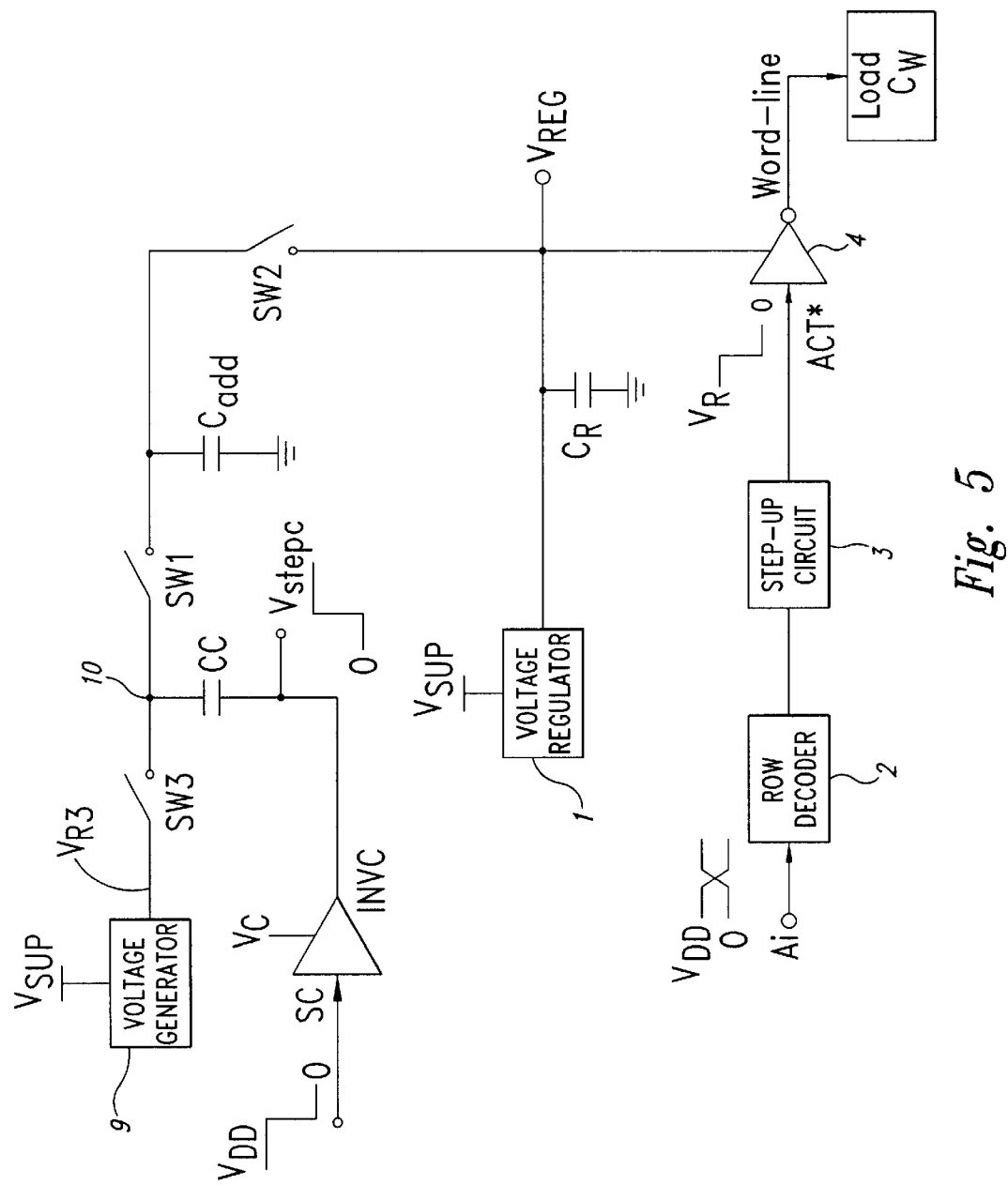
FIG. 5 schematically shows a circuit according to a second embodiment of the present invention.

The second embodiment that is shown as an example in FIG. 5 solves this possible drawback, thus preventing the need to provide a real voltage regulator capable to supply a voltage higher than $V_R$. In this figure, the elements identical to the ones in the previous figures have the same reference numbers. In the circuit of FIG. 5 the additional capacitor $C_{add}$ is at first charged at a value of voltage $V_{R3}$, ideally equal to $V_R$, that is generated by a voltage generator 9 (for example also consisting of a voltage regulator analogous to the regulator 1), through the switches SW1 and SW3. The capacitor $C_{add}$ is then charged with the value $V_{R3}+\Delta V$ by means of the application of a voltage step $V_{stepc}$ to the lower plate of a capacitor $C_C$ whose upper plate is connected with the intermediate node 10 between the two switches SW1 and SW3. The voltage step $V_{stepc}$ is supplied by means of an inverter INVC, that is controlled by a logic signal SC variable between ground and the supply voltage $V_{DD}$ of the integrated circuit, if the supply voltage of the inverter INVC, $V_C$, is equal or lower than $V_{DD}$, as it is preferable for a more efficient embodiment of the present solution, as shown afterwards. If the value of $V_C$ were higher than $V_{DD}$, the logic signal SC would be variable between ground and $V_C$. The inverter INVC is supplied with a voltage $V_C$ of appropriate value, as it will be discussed hereinafter. The sizing of the components, in particular of the additional capacitor $C_{add}$, will have to meet the same relationship that was discussed for the first embodiment, that is $C_{add} \times \Delta V = C_W \times V_R$.

During the normal operation of the circuit, when the selection of one (or more) new word line is not requested, the switches SW1 and SW3 are closed while the switch SW2 is open. The signal SC is at a high logic level (e.g. of value equal to $V_{DD}$). The two capacitors $C_C$ and $C_{add}$ are precharged with the voltage $V_{R3}$ therefore, which is ideally equal to $V_R$.

When there is a new request for reading that requires the selection of one (or more) different word line, the switch SW3 gets opened and the signal SC is brought to a low logic level. That determines an increase in the voltage on the node 10 equal to:

$$\Delta V = V_C \times C_C/(C_{add}+C_C) = V_C/(1+C_{add}/C_C).$$

At this point the circuit is in the same situation that has been examined for the circuit of FIG. 3. When the new word line (word lines) is (are) selected, and therefore the capacitance $C_W$ is connected with the line $V_{reg}$, the additional capacitor $C_{add}$ is disconnected from the node 10 (by opening the switch SW1) and it is connected between the line $V_{reg}$, and ground (by closing the switch SW2).

The following equation must be met:

$$(C_{add}/C_W) \times [1/(C_{add}+C_C)] \times V_C = V_R.$$

In order to have the best effectiveness in capacitance compensation, that is in order for the charge $C_{add} \times \Delta V$ transferred from the capacitor $C_{add}$ to the line $V_{reg}$ to be as much as possible equal to $C_W \times V_R$, it is necessary for the value of the voltage $V_C$ to be accurate and for the factor $(C_{add}/C_W) \times [1+C_{add}/C_C)]$ to have a precise value. For this purpose, the voltage $V_C$ can be generated by means of a regulation circuit that utilizes a band-gap type reference voltage. With an adequate sizing of the capacitor $C_C$ the value of the voltage $V_C$ can be lower than $V_{DD}$, therefore the voltage regulator for the generation of the voltage $V_C$ can be supplied with $V_{DD}$. As for what concerns the factor $(C_{add}/$ $C_W)\times[1+C_{add}/C_C)]$, this depends on relationships between capacitances. In order to reduce the dependence of this factor on the differences ("mismatch") between $C_{add}$ and $C_C$, the relationship $C_{add}/C_C$ can be kept very low; that is, the capacitor $C_C$ can be sized in order to have a much higher capacitance than the one of the capacitor $C_{add}$. The limit value of the factor $(C_{add}/C_C)\times[1+C_{add}/C_C)]$ is evidently equal to $(C_{add}/C_W)$, obtainable when $C_{add}/C_C$ is around zero, and it corresponds to a value $\Delta V \cong V_C$. With this expedient, the only important parameter is the matching between $C_{add}$ and $C_W$ as in the solution according to the first embodiment. This allows us to realize a capacitor $C_C$ that has not necessarily a good matching with the capacitor $C_W$. For the realization of the capacitor $C_C$ it is not therefore necessary to resort to the use of dummy word lines.

With respect to the precharging of the two capacitors $C_C$ and $C_{add}$, the capacitor $C_C$ can be precharged again to the value $V_{R3}$ as soon as the switch SW1 has been opened. For the capacitor $C_{add}$ instead the same considerations developed previously with reference to FIG. 3 are true. The charging that the regulator 9 must provide is not excessive and it can be attained in an interval of time substantially higher than the time required for the recovery of the word line voltage. The regulator 9 can be sufficiently fast, since its output capacitive load is given by the parallel of $C_C$ and $C_{add}$, in addition to stray contributions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit for the regulation of a row voltage in a memory, comprising: a voltage regulator suitable to generate an output regulated voltage to be supplied to one or more rows of the memory when said one or more rows are being selected; and charge accumulation means selectively connectable with the output of the voltage regulator and configured to accumulate a compensation charge for a voltage drop that takes place on said regulated voltage upon the selection of said one or more rows of the memory, said charge accumulation means comprising at least a capacitor having a first plate connected with a memory reference potential and a second plate that is selectively couplable to a precharging circuit or to the output of said voltage regulator.

2. The circuit of claim 1 wherein in that said at least one capacitor is configured such that the charge stored therein is substantially equal to the product of its capacitance by the nominal value of the regulated voltage plus a quantity that is substantially equal to the quantity of charge to be supplied to said one or more selected memory rows so as to bring the potential of said one or more selected rows to a pre-established value.

3. The circuit of claim 1, further comprising first switch means and second switch means in order to selectively couple the second plate of said at least one capacitor respectively to said precharging circuit or to the output of the voltage regulator.

4. The circuit of claim 2 wherein said precharging circuit comprises a voltage generator whose output is selectively couplable to said second plate of said at least one capacitor.

5. The circuit of claim 4, wherein said voltage generator generates a voltage substantially equal to the pre-established voltage that is increased by an incremental voltage such that the quantity of incremental charge stored in said at least one capacitor due to the effect of said incremental voltage is substantially equal to the quantity of charge to be supplied to said one or more selected word lines in order to bring the potential of the one or more selected word lines to said pre-established value.

6. The circuit of claim 1 wherein in that said precharging circuit comprises a second voltage regulator having an output that is selectively couplable to said second plate of said at least one capacitor.

7. The circuit of claim 6 wherein said second voltage regulator supplies an output voltage that is substantially equal to the pre-established voltage increased by an incremental voltage such that the quantity of incremental charge stored in said at least one capacitor due to the effect of said incremental voltage is substantially equal to the quantity of charge to be supplied to said one or more selected word lines in order to bring the potential of the one or more selected word lines to said pre-established value.

8. The circuit of claim 4, further comprising means for boosting the potential of said second plate of said at least one capacitor.

9. A memory comprising a plurality of selectionable rows, selection means for one or more of said rows to bring the potential of said one or more selectable rows to a pre-established value; and one or more regulation circuits comprising a voltage regulator suitable to generate an output regulated voltage to be supplied to one or more rows of the memory when said one or more rows are being selected; and charge accumulation means selectively connectable with the output of the voltage regulator and suitable to accumulate a compensation charge for a voltage drop that takes place on the regulated voltage upon the selection of one or more rows of the memory, said charge accumulation means comprising at least a capacitor having a first plate connected with a memory reference potential and a second plate that is selectively couplable to a precharging circuit or to the output of the voltage regulator.

10. The memory of claim 9, further comprising first switch means and second switch means to selectively couple the second plate of the at least one capacitor alternatively to the precharging circuit and to the output of the voltage regulator.

11. The memory of claim 10, further comprising a second voltage regulator having an output that is selectively coupleable to the second plate of the at least one capacitor.

12. A voltage regulator circuit, comprising:
  a voltage supply; and
  a capacitive element selectively couplable by a first switch to an output of the voltage supply and configured to selectively store and output a compensation charge for a predetermined voltage drop through a second switch on the output of the voltage supply to a memory word line.

13. The circuit of claim 12, further comprising a control circuit coupled to the first and second switches and operable to alternately open and close the first and second switches such that only one of the first and second switches is closed at a time.

14. The circuit of claim 12 wherein the capacitive element is configured to output a compensation charge substantially equal to: $C_W \times V_R$ where, $C_W$ is the capacitance of the word lines, and $V_R$ is the nominal voltage of the voltage provided to the selected word lines by the voltage supply.

15. The circuit of claim 12 wherein the capacitive element has a first plate coupled to a reference voltage and a second plate alternatively coupleable to the output of the voltage supply and to a voltage source.

16. The circuit of claim 12 wherein the capacitive element comprises a plurality of capacitors, each capacitor individually coupleable to the output of the voltage supply.

* * * * *